United States Patent
Engelbach et al.

(10) Patent No.: US 8,866,012 B2
(45) Date of Patent: *Oct. 21, 2014

(54) SENSOR LEAD SEALING AND STRAIN RELIEF

(71) Applicant: Stoneridge, Inc., Warren, OH (US)

(72) Inventors: Brian Engelbach, Mansfield, OH (US); Robert J. Sparks, Bellville, OH (US); Tim Murphy, Perrysville, OH (US); Jeffrey T. Norris, Fredericktown, OH (US); Michael L. Heston, Mansfield, OH (US)

(73) Assignee: Stoneridge, Inc., Warren, OH (US)

( * ) Notice: Subject to any disclaimer, the term of this patent is extended or adjusted under 35 U.S.C. 154(b) by 85 days.

This patent is subject to a terminal disclaimer.

(21) Appl. No.: 13/724,477

(22) Filed: Dec. 21, 2012

(65) Prior Publication Data

US 2014/0008094 A1    Jan. 9, 2014

Related U.S. Application Data

(63) Continuation of application No. 12/724,281, filed on Mar. 15, 2010, now Pat. No. 8,338,702.

(60) Provisional application No. 61/159,955, filed on Mar. 13, 2009.

(51) Int. Cl.
*H05K 5/00* (2006.01)
*G01K 1/08* (2006.01)
(Continued)

(52) U.S. Cl.
CPC ............... *G01D 11/245* (2013.01); *G01K 1/08* (2013.01); *H01R 2201/20* (2013.01); *H05K 5/00* (2013.01); *G01K 1/14* (2013.01); *H01B 7/0045* (2013.01); *H01R 13/533* (2013.01); *G01K 2205/04* (2013.01); *Y10S 248/906* (2013.01)

USPC .............. 174/50; 174/58; 374/100; 439/535; 248/906

(58) Field of Classification Search
USPC ...................... 174/50, 58; 439/535; 220/4.02; 248/906; 374/100, 185

See application file for complete search history.

(56) References Cited

U.S. PATENT DOCUMENTS 5,716,231 A * 2/1998 Meeker et al. ................ 439/502
5,837,933 A    11/1998 Fligelman
(Continued)

FOREIGN PATENT DOCUMENTS

GB    2151416    7/1985

OTHER PUBLICATIONS

Japanese Office Action dated Nov. 12, 2013 in corresponding Japanese Patent Application No. 2011-554272.
(Continued)

*Primary Examiner* — Dhirubhai R Patel
(74) *Attorney, Agent, or Firm* — Grossman, Tucker, Perreault & Pfleger, PLLC

(57) ABSTRACT

A sensor system includes a wiring harness including at least one wire, a grommet, a nugget, a sensor, and a harness sleeve, wherein the grommet includes at least one passageway configured to receive the wire and the nugget includes at least one terminal molded into the nugget and coupled to the wire. A mineral insulated cable may be coupled to the sensor and to the terminal and the harness sleeve may define at least one cavity configured to receive the nugget and at least a portion of the grommet. The harness sleeve may be coupled to the mineral insulated cable and may include a first crimp coupling the harness sleeve to the grommet. The harness sleeve may also include a second crimp coupling the harness sleeve to the nugget.

20 Claims, 9 Drawing Sheets

(51) Int. Cl.
    *G01D 11/24*  (2006.01)
    *G01K 1/14*  (2006.01)
    *H01B 7/00*  (2006.01)
    *H01R 13/533*  (2006.01)

(56) References Cited

U.S. PATENT DOCUMENTS

| | | | |
|---|---|---|---|
| 6,291,770 B1 * | 9/2001 | Casperson | 174/72 A |
| 7,478,616 B2 * | 1/2009 | Micu et al. | 123/143 C |
| 8,653,365 B1 * | 2/2014 | Mixon | 174/71 R |
| 2002/0189215 A1 | 12/2002 | Goyetche | |
| 2008/0025372 A1 | 1/2008 | Culbertson | |

OTHER PUBLICATIONS

International Search Report and Written Opinion dated May 11, 2010 issued in related International Patent Application No. PCT/US2010/027344.

Chinese Office Action dated Oct. 26, 2012 issued in related Chinese Patent Application No. 201080019426.1.

Chinese Office Action dated Jul. 1, 2013 issued in corresponding Chinese Patent Application No. 201080019426.1.

* cited by examiner

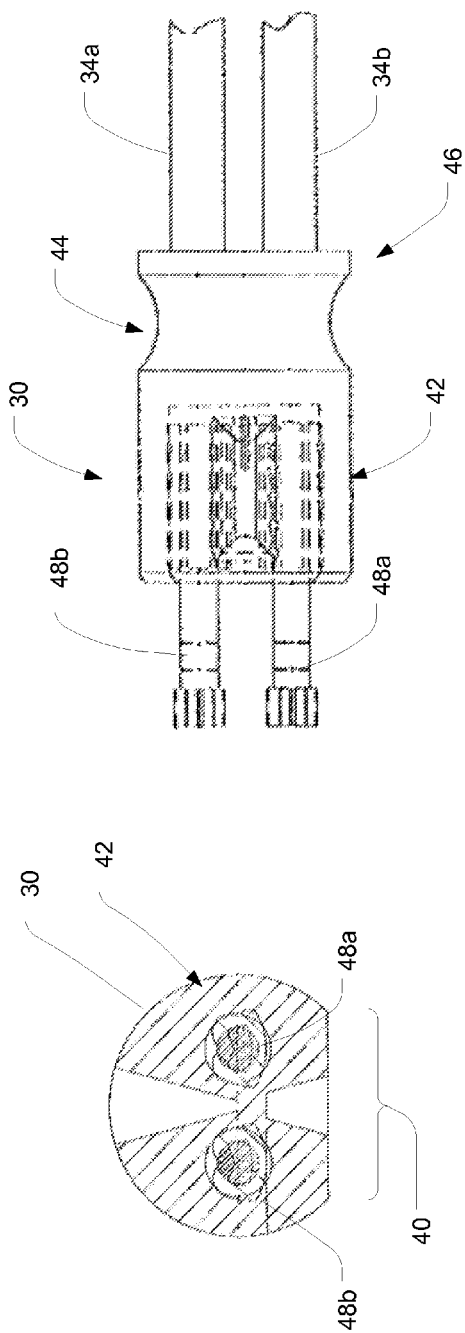
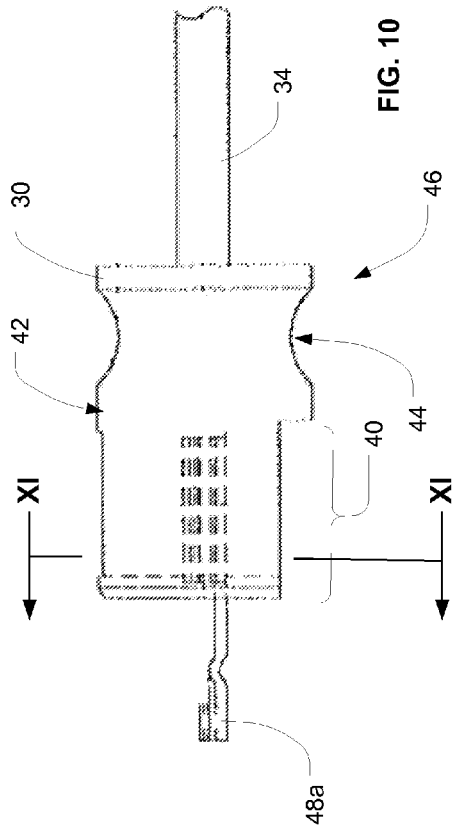
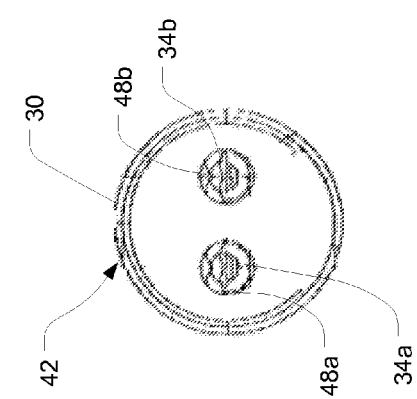
FIG. 12
FIG. 10
FIG. 11
FIG. 6

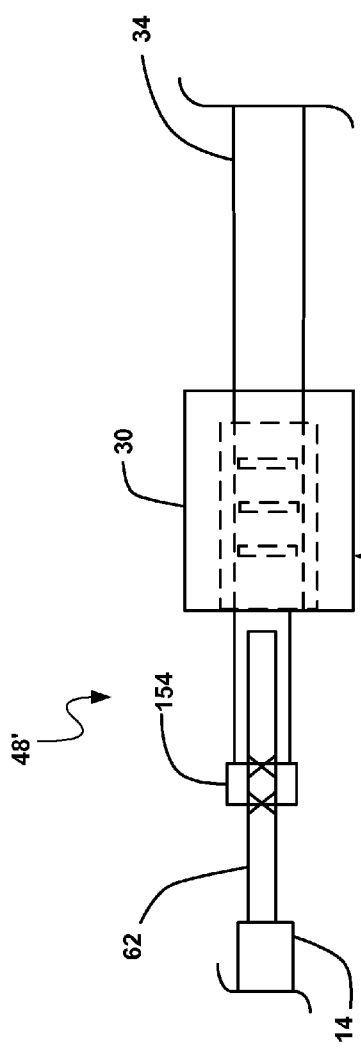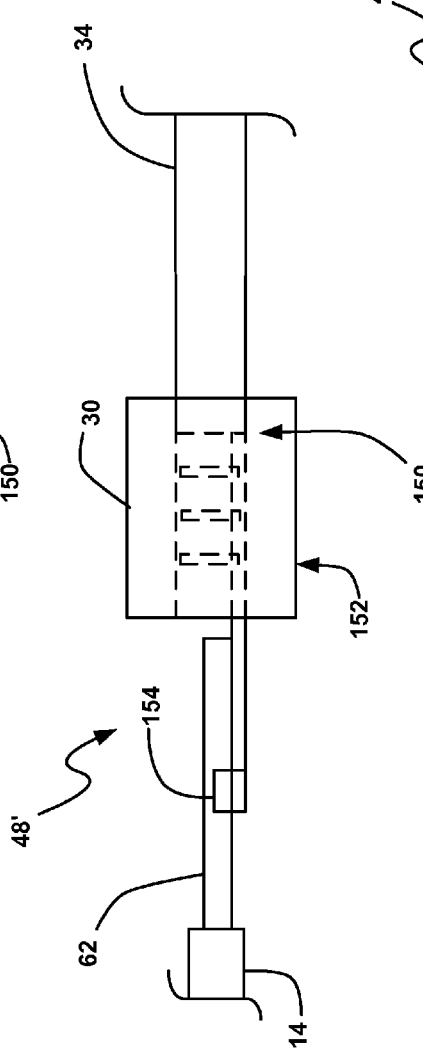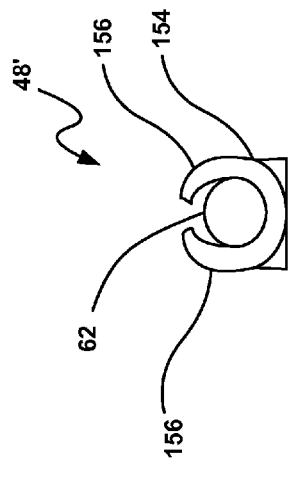

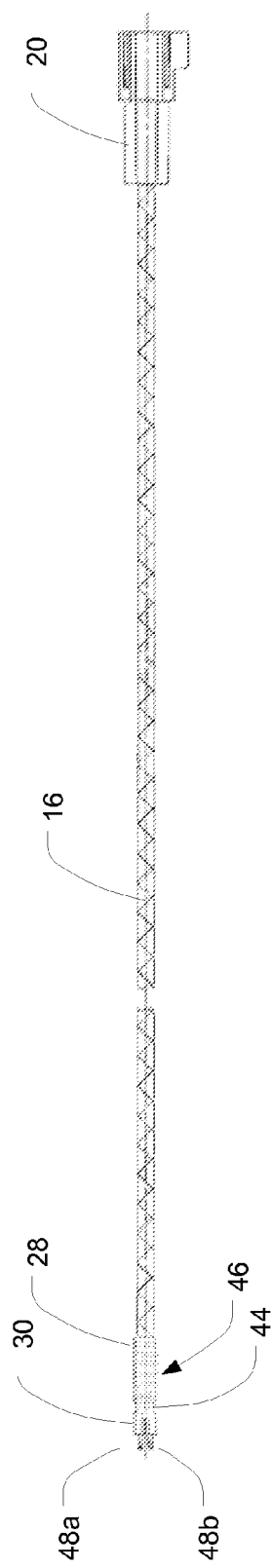
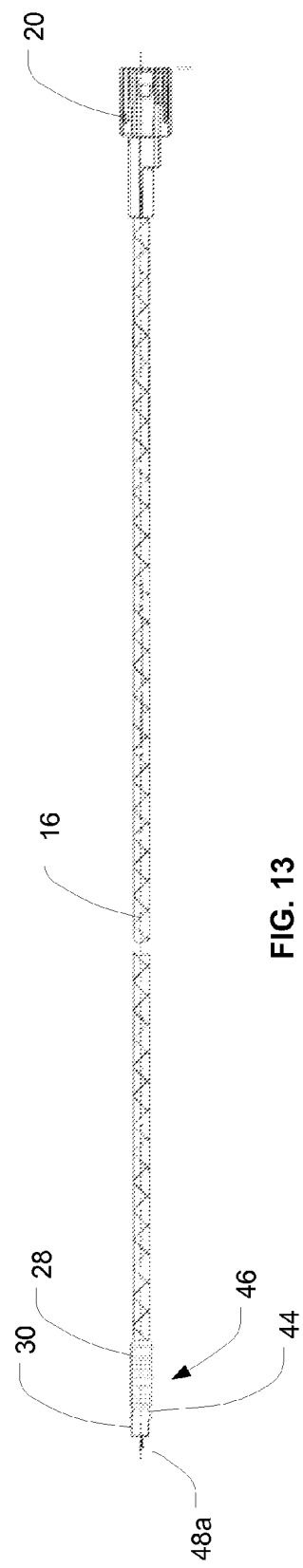
FIG. 14
FIG. 13

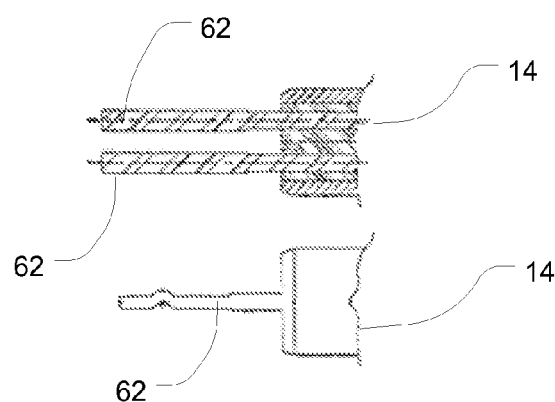
FIG. 16
FIG. 17
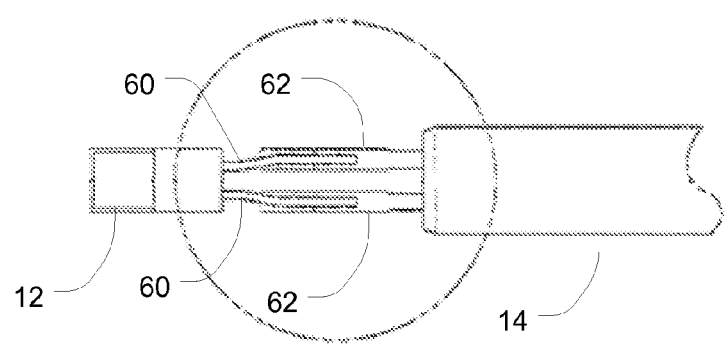
FIG. 18
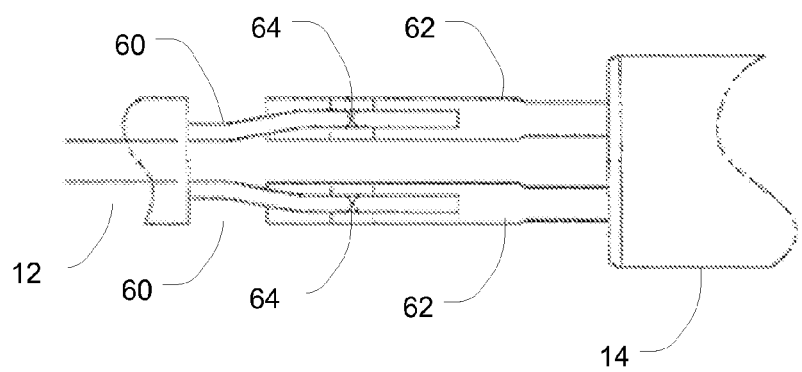
FIG. 19

SENSOR LEAD SEALING AND STRAIN RELIEF

CROSS REFERENCE TO RELATED APPLICATIONS

This application is a continuation of U.S. patent application Ser. No. 12/724,281, filed Mar. 15, 2010, which claims the benefit of U.S. Provisional Patent Application Ser. No. 61/159,955, filed Mar. 13, 2009, the teachings of which are hereby incorporated herein by reference.

FIELD

The present disclosure relates generally to sensors for internal combustion engines. More specifically, the present disclosure may relate to a coupler for mechanically and/or electrically coupling a mineral insulated cable to a wiring harness that reduces moisture intrusion, provides terminal location, provides stain relief and/or increases the continuous use temperature rating.

BACKGROUND

Internal combustion engines such as, but not limited to, diesel and gasoline engines, may include one or more sensors such as, but not limited to, temperature sensors at least partially disposed within the exhaust gas system. For example, these temperature sensors may sense the temperature of the exhaust gas and may be used, at least in part, by an engine control system to adjust one or more properties of the engine such as, but not limited to, air/fuel ratio, boost pressure, timing or the like. Because of the operating environment, the temperature sensors may be exposed to relatively harsh conditions including, but not limited to, vibration, exposure to debris, moisture and corrosive chemicals, large temperature ranges and relatively high continuous use operating temperatures. The conditions may degrade the performance of the temperature sensors and may, ultimately, render the temperature sensors unsuitable for their intended purpose.

BRIEF DESCRIPTION OF THE DRAWINGS

Features and advantages of embodiments of the disclosed subject matter will become apparent as the following Detailed Description proceeds, and upon reference to the Drawings, where like numerals depict like parts, and in which:

FIG. 6 is an end view of the nugget in accordance with the present disclosure;

FIG. 7 is a top view of one embodiment of a connection between the terminal in nugget and the conductors of the mineral insulated (MI) cable in accordance with the present disclosure;

FIG. 8 is a side view of the connection shown in FIG. 7 in accordance with the present disclosure;

FIG. 9 is an end view of the connection shown in FIG. 7 in accordance with the present disclosure;

FIG. 10 is a side view of one embodiment of a nugget in accordance with the present disclosure;

FIG. 11 is a cross-sectional view of the nugget in accordance with the present disclosure in FIG. 10 taken along lines XI-XI;

FIG. 12 is a top view of the nugget shown in FIG. 10 in accordance with the present disclosure;

FIG. 13 is a side view of a wiring harness in accordance with the present disclosure;

FIG. 14 is another side view of a wiring harness in accordance with the present disclosure;

FIG. 16 is a top view of the end of the MI cable in accordance with the present disclosure;

FIG. 17 is a side view of the end of the MI cable of FIG. 16 in accordance with the present disclosure;

FIG. 18 is a top view of the connection between the sensor and the mineral insulated cable in accordance with the present disclosure;

FIG. 19 is a close-up view of the connection between the sensor and the mineral insulated cable shown in FIG. 18 in accordance with the present disclosure;

DETAILED DESCRIPTION

Figure 1:
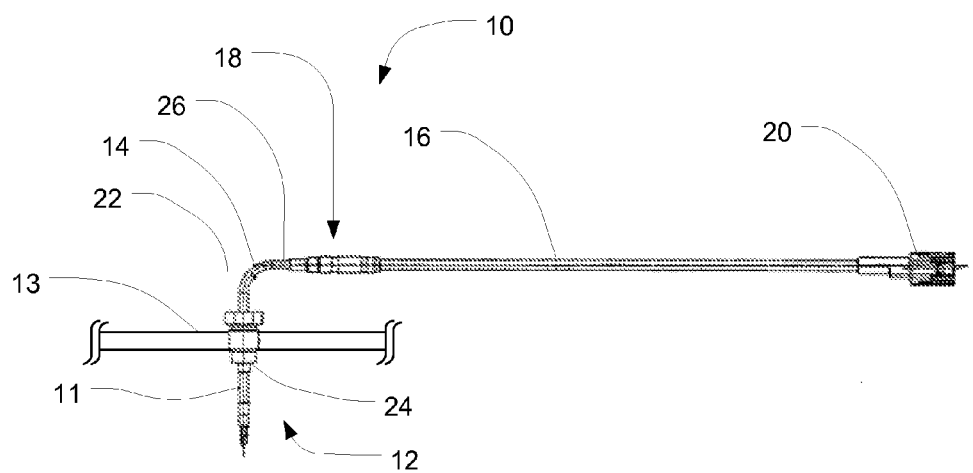
FIG. 1 is a plan view of a sensor system coupled to a housing according to the present disclosure.
Figure 2:
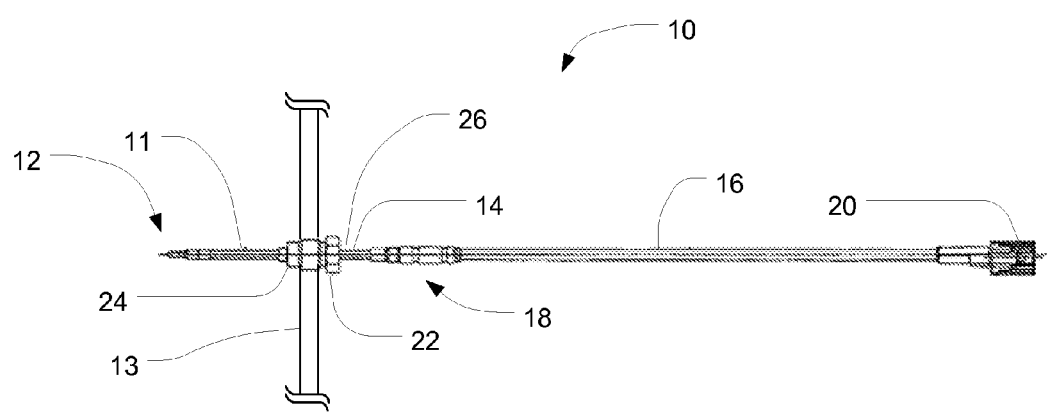
FIG. 2 is plan view of another embodiment of a sensor system coupled to a housing according to the present disclosure.

Referring now to the drawings, FIGS. 1 and 2 illustrate a sensor system 10 consistent with at least one embodiment herein. The sensor system 10 will be described in terms of an exhaust gas sensor system. For example, the sensor system 10 may comprise a temperature sensor such as, but not limited to, an exhaust gas sensor system which may be configured to be used with an internal combustion engine such as, but not limited to, a diesel engine, a gasoline engine, or the like. The output of the exhaust gas sensor system may be received by an engine control unit (ECU) or engine control module (ECM) or the like to control one or more parameters of the engine, for example, but not limited to, air/fuel ratio, boost pressure, timing or the like. It should be appreciated, however, that the sensor system 10 may comprise other types of sensor systems (e.g., but not limited to, a sensor system configured to detect, sense and/or monitor catalytic converter temperature, lubricant temperature (such as, but not limited to, engine oil, transmission oil, differential oil, or the like), brake temperature, engine coolant temperature, or the like). In addition, the sensor system 10 may include other types of sensors, for example, sensors configured to detect, sense and/or monitor other parameters including, but not limited to, pressure, speed, position or the like.

The sensor system 10 may comprise a sensor 12 (e.g., but not limited to, a temperature sensor) coupled to a cable 11, a wire harness assembly 16, and a coupler 18 configured to couple the cable 11 to the wire harness assembly 16. Optionally, a connector 20 may be provided to electrically and/or mechanically couple the sensor system 10 (and in particular, the wire harness assembly 16) to a wiring loom or the like, and ultimately to at least a portion and/or subsystem of the ECU and/or ECM. The sensor 12 may be configured to output a signal representative of the parameter being detected, sensed and/or monitored. The sensor 12 may be selected depending on the intended parameter to be detected, sensed and/or monitored, the operating range, accuracy and/or precision desired. For example, the sensor 12 may comprise a temperature sensor configured to output a signal representative of the temperature of the exhaust gas, for example, the exhaust gas flowing through at least a portion of the exhaust gas system. According to at least one embodiment consistent herein, the temperature sensor 12 may include a resistive temperature detector (RTD).

The sensor system 10 may be configured to removably connect, mount, or otherwise secure the sensor 12 to a housing 13 (only a portion of which is shown for clarity) such as, but not limited to, a portion of an exhaust pipe, down pipe, exhaust manifold, or the like. For example, the sensor system 10 may include a nut 22 and optionally a stop flange 24. A portion of the sensor system 10 may be threaded to engage with a threaded aperture in the housing 13, for example, until the stop flange 24 engages the housing 13 (for example, a shoulder or the like).

Because of the relative high operating temperatures of the exhaust system and the close proximity of the sensor 12 to the heat source, the sensor 12 may be electrically coupled to the wire harness assembly 16 or the like using a cable 11. The cable 11 may comprise various types of cables, such as, but not limited to, a mineral insulated (MI) cable or ceramic insulator. For example, a MI cable 14 may comprise one or more wires disposed within a sheath 26 (e.g., a metal sheath) which are configured to electrically couple the sensor 12 to the wiring harness 16. The sheath 26 may provide mechanical strength and/or protection to the MI cable 14 and may also position the temperature sensor 12 and/or wiring harness 16 to prevent contact with other components. The mineral insulation may provide the necessary thermal resistance for the sensor system 10 to withstand the high temperatures experienced within an exhaust system. The MI cable 14 may, however, be particular sensitive to moisture absorption. For example, humidity in the ambient air may cause a dielectric failure if the air has access within the MI cable 14. As discussed herein, the sensor system 10 may include a coupler 18 configured to reduce or eliminate water absorption of the MI cable 14, particularly from water being absorbed into the MI cable 14 from the end of the MI cable 14 connected to the wiring harness 16.

Figure 3:
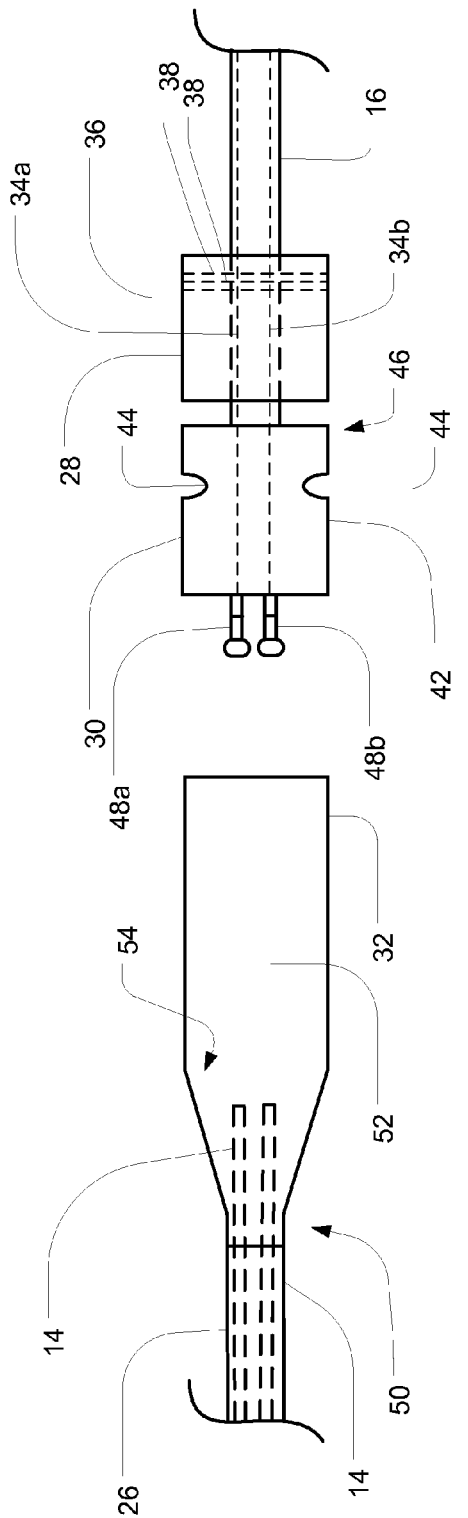
FIG. 3 is an exploded, perspective view of one embodiment of a coupler in accordance with the present disclosure.
Figure 4:
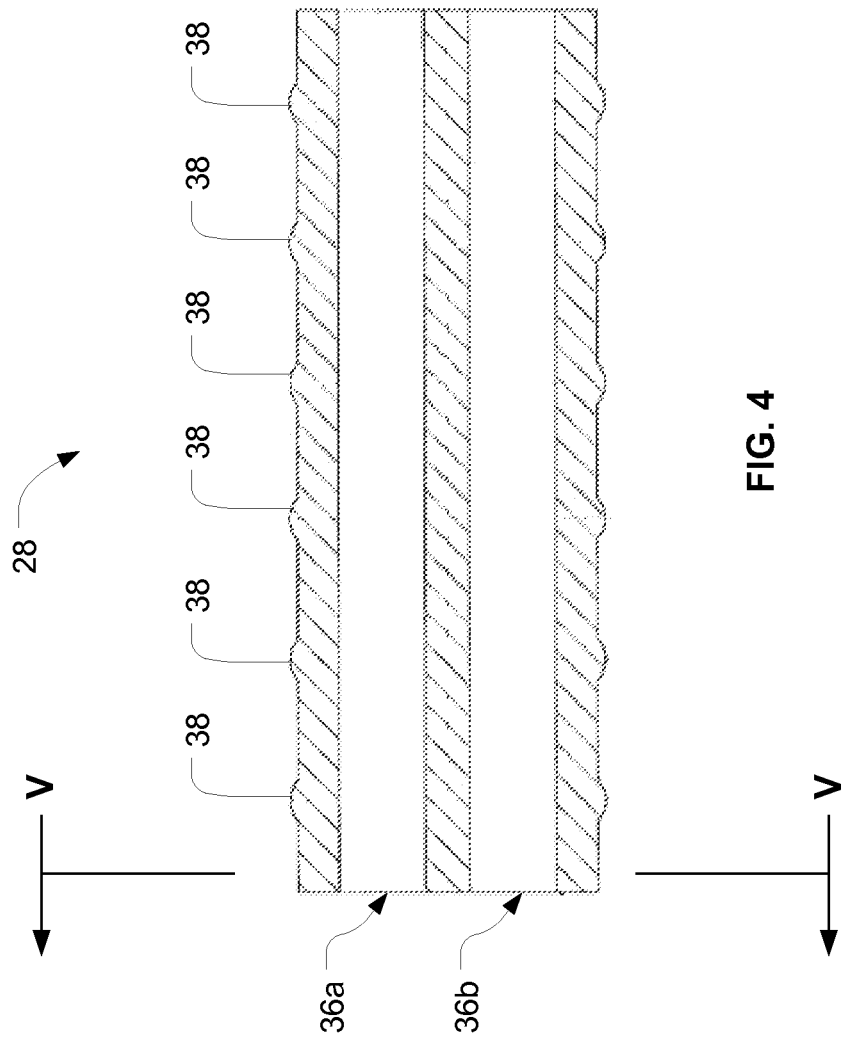
FIG. 4 is a cross-sectional view of a grommet as shown in FIG. 3.
Figure 5:
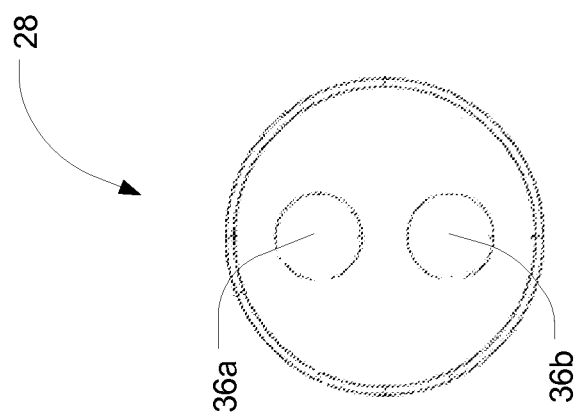
FIG. 5 is a sectional view of one embodiment of a grommet illustrated in FIG. 4 taken along lines V-V in accordance with the present disclosure.

Turning now to FIG. 3, an exploded view of one embodiment of a coupler 18 is generally illustrated. The coupler 18 may include a grommet 28, a nugget 30 and a harness sleeve 32 coupled to the sheath 26 of the MI cable 14 which defines a cavity 52 configured to receive the grommet 28 and nugget 30. The grommet 28 may form a high temperature seal between the wires 34a, 34b of the wiring harness 16 and the harness sleeve 32. The grommet 28 may include at least one longitudinally disposed passageway or cavity 36 configured to receive a portion of the wiring harness 16 and/or the wires 34a, 34b of the wiring harness 16. According to at least one embodiment, the grommet 28 may have a generally cylindrical configuration comprising a first and a second passageway 36a, 36b as generally illustrated in FIGS. 4 and 5. The passageways 36a, 36b may be configured to receive the wires 34a, 34b as described herein. The grommet 28 may optionally include at least one radially disposed protrusion or rib 38. The ribs 38 may be disposed along the longitudinal length of the grommet 28 and may provide multiple sealing edges with the harness sleeve 32.

The grommet 28 may include a high temperature elastomer material. The elastomer material may include a resiliently deformable material configured to form a seal as described herein and may be configured to be partially compressed by the harness sleeve 32. For example, the grommet 28 may include a high temperature fluorocarbon rubber. The fluorocarbon rubber may be configured to withstand temperatures of up to 536 degrees F.

Referring back to FIG. 3, the nugget 30 may be configured to provide strain relief for the wire harness 16 and may also be configured to provide the proper orientation and spacing of the wire terminals 48a, 48b. For example, the terminals 48a, 48b may be coupled to the ends of the wires 34a, 34b of the wire harness 16 may be insert and/or over-molded into a high temperature plastic nugget 30 to fix the orientation of the terminals 48a, 48b for resistance welding with the MI cable 14 as generally illustrated in FIG. 6. The nugget 30 may include, at least in part, a high temperature liquid crystal polymer configured to withstand the high ambient temperatures common to exhaust systems (e.g., but not limited to, diesel exhaust systems). The material of the nugget 30 may also be configured to provide electrical insulation and to bond the wire terminals 48a, 48b in the proper orientation and spacing for welding to the conductors inside the MI cable 14.

Turning now to FIGS. 7-9, one embodiment 48' of at least one of the terminals 48a, 48b for coupling with the MI cable 14 is generally illustrated. The terminal 48' may include a first end 150 molded within the nugget 30 coupled to one or more of the wires 34 of the wiring harness 16, for example, via welding, crimping or the like. A second, generally opposite end 152 of the terminal 48' may include a basket 154 configured to receive a portion of the end of the conductors 60 of the MI cable 14. The basket 154 may facilitate alignment and may reduce any movement of the terminals 48' and the conductors 62 prior to and/or during welding. As generally illustrated, the basket 154 may define a pocket, cavity and/or groove configured to receive the ends of the MI cable 14. The basket 154 may include sidewall 156 that may be guide and/or generally locate the conductor 62 as generally illustrated in FIG. 9.

Referring now to FIGS. 10 and 11, the nugget 30 may optionally include an exterior shape configured to facilitate loading into an automated welding machine. For example, the nugget 30 may include one or more generally flat and/or planar regions 40 configured to facilitate loading into an automated welding machine. The flat region 40 may allow the automatic welding machine to properly orientate the nugget 30, for example, by providing an easily identifiable orientation feature. While the nugget 30 is illustrated having a generally flat and/or planar region 40, the nugget 30 may also include other shapes configured to allow provide an orientation feature such as, but not limited to, an indentation, protrusion, or the like. The nugget 30 may also include one or more protrusions molded into the top and/or bottom of the nugget 30 configured to maintain the terminals 48 separated during the molding process and to prevent electrical short circuits.

Figure 26:
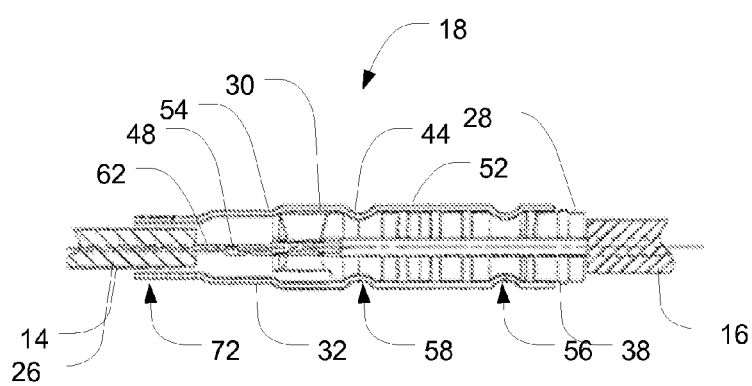
FIG. 26 is a side view of the connection between the MI cable and the wiring harness including a grommet and a nugget within the harness sleeve in accordance with the present disclosure.

As generally illustrated in FIGS. 10 and 12, the exterior surface 42 of the nugget 30 may optionally include one or more indentations or grooves 44. The groove 44 may include a radial groove molded into a portion of the exterior surface 42 of the nugget 30. For example, consistent with at least one embodiment the groove 44 may be disposed about a proximal end region 46 of the nugget 30 which may be substantially adjacent to the grommet 28 when assembled. The groove 44 may be configured to engage and/or mechanically couple the nugget 30 with harness sleeve 32, for example, as generally illustrated in FIG. 26. The groove 44 may also be configured to self-align the nugget 30 into the harness sleeve 32 when the harness sleeve 32 is crimped as described herein.

Turning now to FIGS. 13 and 14, the wiring harness assembly 16 is illustrated with the grommet 28 and the nugget 30 secured thereto. The grommet 28 may be advanced over a portion of the wiring harness assembly 16. The nugget 30 may also be insert-molded to the wiring harness assembly 16. The terminals 48a, 48b may extend generally outwardly beyond the nugget 30 and may be configured to be coupled to (for example, welded to) the ends of the MI cable 14 (not shown). The nugget 30 may be disposed substantially adjacent to the grommet 28. According to at least one embodiment, the grommet 28 may directly contact against the proximal end region 46 of the nugget 30.

Figure 15:
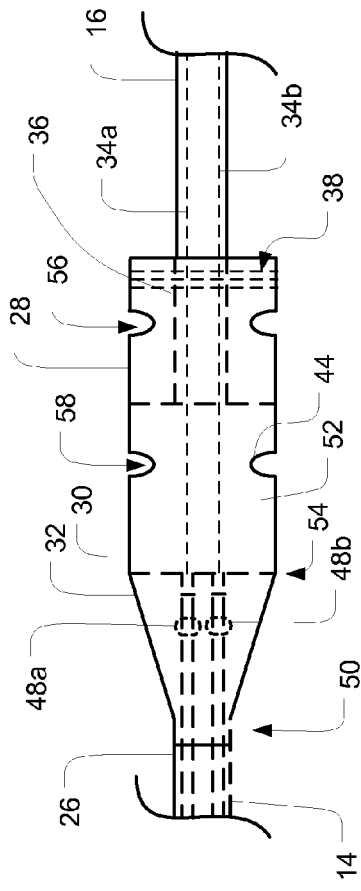
FIG. 15 is a partially assembled view of one embodiment of a coupler in accordance with the present disclosure.

Referring back to FIG. 3, the harness sleeve 32 may include a first end region 50 configured to be coupled to the sheath 26 of the MI cable 14. For example, the first end region 50 of the harness sleeve 32 may be welded to a proximal end of the sheath 26. The harness sleeve 28 may define at least one cavity 52 configured to receive at least a portion of the grommet 28 and nugget 30 as generally illustrated in FIG. 15. The cavity 52, grommet 28 and/or nugget 30 may be configured to form an interference type or a friction fit. The cavity 52 may also have interior dimensions slightly larger than the outer dimensions of the grommet 28 and/or nugget 30 such that the grommet 28 and/or nugget 30 are readily received within the cavity 52 while providing a close tolerance, for example, of less than 10%, less than 5%, or less than 2%. The cavity 52 may optionally include step or tapered/conical region 54. The tapered region 54 may be configured to abut against a portion of the nugget 30, thereby preventing over-insertion of the nugget 30 in the cavity 52 and thereby reducing the potential for the terminals 48a, 48b to short against the harness sleeve 32.

Once the grommet 28 and nugget 30 are received within the cavity 52 of the harness sleeve 32, the harness sleeve 32 may be crimped to form a mechanical connection. For example, the harness sleeve 32 may be crimped about a portion overlaying the grommet 28 to form a first crimp 56 which may compress the elastomer material of the grommet 28. In the non-compressed state, the passageway 36 of the grommet 28 may be configured to readily received the harness wire 16 and/or wires 34a, 34b and may have an outer size and/or shape configured to be readily received in the cavity 52 of the harness sleeve 32 to facilitate assembly of the sensor system 10. The first crimp 56 between the harness sleeve 32 and the grommet 28 may compress the elastomer material of the grommet 28 thereby substantially eliminating any clearance provided between the grommet 28 and the wires 34a, 34b of the wire harness assembly 16 and forming a seal between the grommet 28 and the wire harness assembly 16. The first crimp 56 may also substantially eliminate any clearance provided between the grommet 28 and the harness sleeve 32 thereby forming a seal.

The harness sleeve 32 may also be crimped about a portion overlaying the nugget 30 to form a second crimp 58. The second crimp 58 between the harness sleeve 32 and the nugget 30 may generally secure the nugget 30 to the harness sleeve 32 and, along with the bonding of the terminals 48a, 48b to the nugget 30, may provide strain relief for the wire harness 16. According to at least one embodiment, the second crimp 58 may be located about the radial groove 44 in the nugget 30 and may also facilitate alignment of the nugget 30 with respect to harness sleeve 32.

Figure 20:
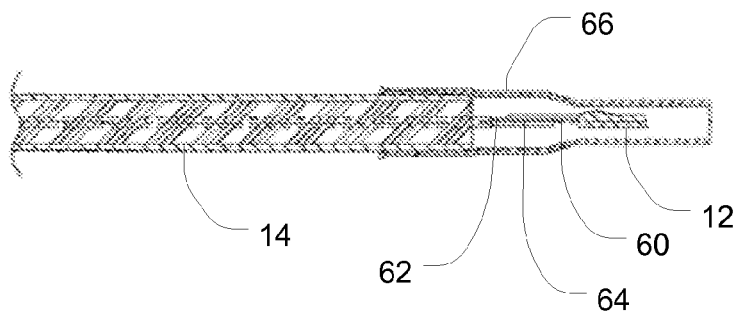
FIG. 20 is a side view of the connection between the sensor and the MI cable in accordance with the present disclosure.
Figure 21:
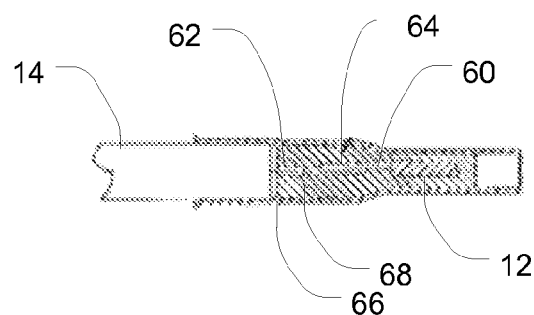
FIG. 21 is a side view of the connection between the sensor and the MI cable filled with packing material in accordance with the present disclosure.
Figure 22:
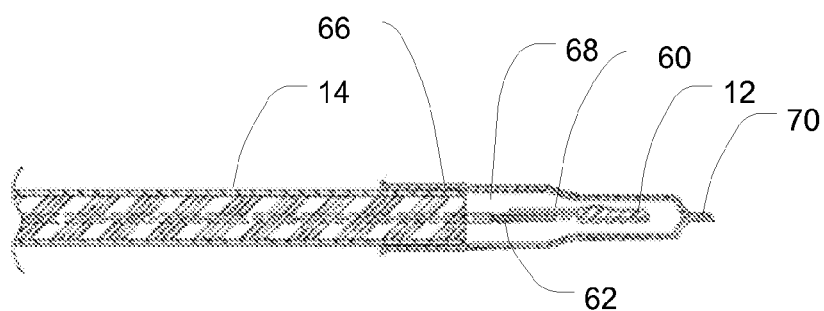
FIG. 22 is a side view of the connection between the sensor and the MI cable forming a tip in accordance with the present disclosure.
Figure 23:
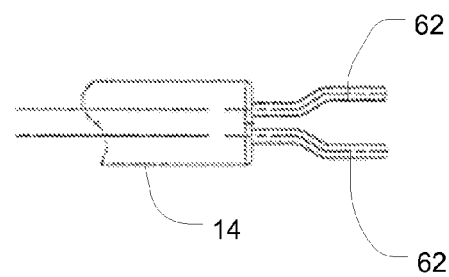
FIG. 23 is a top view of the end of the MI cable in accordance with the present disclosure.
Figure 24:
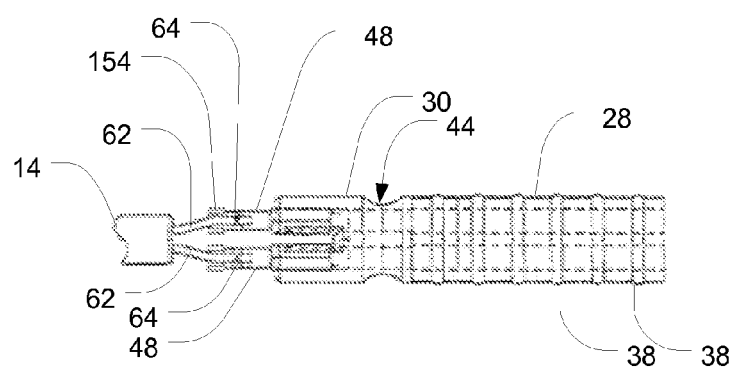
FIG. 24 is a top view of the connection between the MI cable and the wiring harness including a grommet and a nugget in accordance with the present disclosure.
Figure 25:
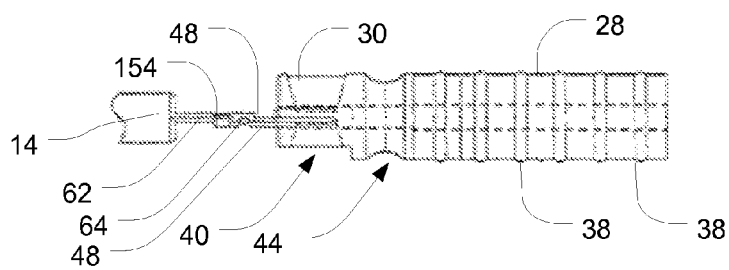
FIG. 25 is a side view of the connection between the MI cable and the wiring harness including a grommet and a nugget in accordance with the present disclosure.

Turning now to FIGS. 16-22, one embodiment illustrating the system and method for coupling the sensor 12 to the MI cable 14 is generally shown. As generally illustrated in FIGS. 16 and 17, a distal end of the MI cable 14 may include conductors 62. The conductors 62 may be coupled to the corresponding leads 60 of the sensor 12 as generally illustrated in FIGS. 18 and 19. According to one embodiment, the conductors 62 and leads 60 may be electrically and/or mechanically secured to each other via one or more crimps, welds, or the like 64 and may be disposed within a sensor sleeve 66 as generally illustrated in FIG. 20. The sensor sleeve 66 may be secured to the MI cable 14, for example, by welding, and adhesive or the like. The sensor sleeve 66 may be filled with packing material 68 such as, but not limited to, magnesium oxide (MgO), aluminum oxide, or boron nitride powder as generally illustrated in FIG. 21. Once filled, the distal end of the sensor sleeve 66 may be crimped and/or welded to form a tip 70 surrounding the sensor 12 as generally illustrated in FIG. 22. The filled sensor 66 may be oxidized prior to welding, for example, at 650 degrees F. minimum.

Turning now to FIGS. 23-26, one embodiment illustrating the system and method for coupling the MI cable 14 to the wiring harness 16 is generally shown. For example, FIG. 23 generally illustrates the proximal end of the MI cable 14 including conductors 62. The conductors 62 may be coupled to the terminals 48 molded into the nugget 30 as generally illustrate in FIGS. 24 and 25. The terminals 48 may receive the conductors 62 of the MI cable 14 (for example, within the baskets 154 as generally illustrated in FIGS. 7-9) and the may be electrically and/or mechanically secured, for example, via one or more crimps, welds, adhesives or the like 64. Once the terminals 48 and conductors 62 are secured, the cavity 52 of the harness sleeve 32 may be advanced over the nugget 30 and at least a portion of the MI cable 14 and the grommet 28 as generally illustrated in FIG. 26. The harness sleeve 32 may be aligned with the nugget 30 using, for example, the step 54 and/or the groove 44. Once aligned, the first and second crimps 56, 58 may be formed in the harness sleeve 32 to seal and/or secure the harness sleeve 32 to the grommet 28 and/or the nugget 30. The harness sleeve 32 may also be secured to sheath 26 of the MI cable 14, for example, by welding, and adhesive or the like 72.

While the wiring harness 16 has been illustrated having two wires 34a, 34b, it should be appreciated that wiring harness 16 may have fewer than or greater than two wires 34a, 34b. For example, the wiring harness 16 may include one wire, three wires, four wires or the like. The grommet 28 and/or the nugget 30 may therefore be configured to receive greater than or fewer than two wires 34a, 34b. Similarly, the MI cable 14 may have fewer than or greater than two wires and/or terminals Accordingly, consistent with at least one embodiment herein, a sensor system may comprise a sensor coupled to a cable, a wire harness assembly, and a coupler configured to couple the cable to the wire harness assembly. The coupler may include a grommet, a nugget, and a harness sleeve. The grommet may include a high temperature seal between the wires of the wiring harness and the harness sleeve. Crimping the grommet into the harness sleeve compresses the elastomer eliminating the clearance provided for easy assembly thus achieving a seal. The nugget may be over-molded to the terminals of the wire harness and may be configured to provide the proper orientation and spacing of the wire terminals. A wide shallow groove may be molded around the outside of the nugget to provide a mechanism of attaching the nugget to the harness sleeve. The mechanical crimping of the nugget in the harness sleeve and the bonding of the terminals inside the nugget may provide strain relief for the wire harness. The high temperature materials allow the sensor junction to be shorter and closer to the heat source. Attaching the wire harness to the cable may be done by resistance welding wire terminals to the conductors of the cable. The wire harness may be capable of withstanding pull force without breaking weld joints between the wire terminals and the conductors within the cable may provide robust strain relief for the wire harness. The material selection and combination may permit a higher continuous use temperature due to thermal conduction, convection and radiation.

According to at least one embodiment consistent herein, the present disclosure may include a sensor system comprising a wiring harness comprising at least one wire, a grommet comprising at least one passageway configured to receive the at least one wire, a nugget comprising at least one terminal coupled thereto; a sensor; a cable coupled to the sensor and to the at least one terminal; and a harness sleeve defining at least one cavity configured to receive the nugget and at least a portion of the grommet, wherein the harness sleeve includes a first crimp coupling the harness sleeve to the grommet to form a seal.

According to yet another aspect, the present disclosure may feature a system comprising a housing and a sensor system. The sensor system may comprise a sensor configured to be coupled to the housing; a wiring harness comprising at least one wire; a grommet comprising at least one passageway configured to receive the at least one wire; a nugget comprising at least one terminal coupled thereto, the at least one terminal coupled to the at least one wire; a cable coupled to the temperature sensor and to the at least one terminal; and a harness sleeve defining at least one cavity configured to receive the nugget and at least a portion of the grommet, wherein the harness sleeve is coupled to the cable and includes a first crimp coupling the harness sleeve to the grommet.

In yet a further aspect, the present disclosure may feature a sensor system comprising a sensor coupled to a cable; a wire harness assembly; and a coupler configured to couple the cable to the wire harness assembly. The coupler may comprise a nugget coupled to the terminals of the wire harness to provide an orientation and spacing of the wire terminals. The nugget may further comprise a wide shallow radial groove about the outside of the nugget. The coupler may also include a grommet comprising an elastomeric material and a harness sleeve coupled to the cable. The harness sleeve may comprise a cavity to receive the nugget and at least a portion of the grommet; a first crimp compressing the elastomer material of the grommet to form a seal between the wires of the wiring harness and the harness sleeve; and a second crimp aligned with the radial groove in the nugget, the second crimp securing the harness sleeve to the nugget, wherein the second crimp provides strain relief for the wire harness.

In an addition aspect, the present disclosure may feature a method of assembling a sensor system. The method may comprise advancing at least one wire of a wiring harness through at least one passageway of a grommet, the at least one wire having a at least one terminal coupled to a distal end; coupling a nugget to a portion of the at least one terminal; coupling a conductor of a cable to the at least one terminal; coupling the cable to a harness sleeve and to a sensor; receiving the nugget and at least a portion of the grommet within a cavity of the harness sleeve; and coupling the harness sleeve to the grommet for form a seal.

The present disclosure has been described in an illustrative manner. It is to be understood that the terminology which has been used is intended to be in the nature of words of description rather than of limitation. The features and aspects described with reference to particular embodiments disclosed herein may be susceptible to combination and/or application in various other embodiments described herein. Such combinations and/or applications of such described features and aspects to such other embodiments are contemplated herein. Additionally, the embodiments disclosed herein are susceptible to numerous variations and modifications without materially departing from the spirit of the disclosed subject matter. Accordingly, the present disclosure herein should not be considered to be limited to the particular embodiments disclosed herein.

What is claimed is:

1. A sensor system comprising:
  a wiring harness comprising at least one wire;
  a grommet comprising at least one passageway configured to receive said at least one wire;
  a nugget comprising at least one terminal coupled thereto, said at least one terminal coupled to said at least one wire, wherein said nugget is disposed proximate a distal end region of said at least one wire and wherein said grommet is adjacent to said nugget;
  a sensor;
  a cable coupled to said sensor and comprising at least one conductor coupled to said at least one terminal; and
  a harness sleeve coupled to said cable, said harness sleeve defining at least one cavity to receive said nugget and at least a portion of said grommet within, wherein said harness sleeve includes a first crimp coupling said harness sleeve to said grommet.

2. The sensor system of claim 1, wherein an exterior surface of said grommet includes at least one radially disposed rib.

3. The sensor system of claim 1, wherein said grommet includes a first and a second passageway configured to receive a first and a second wire of said wiring harness.

4. The sensor system of claim 1, wherein said harness sleeve includes a second crimp coupling said harness sleeve to said nugget.

5. The sensor system of claim 4, wherein an exterior surface of said nugget includes at least one radially disposed groove, wherein said second crimp couples said harness sleeve to said nugget about said radial groove and locates said nugget within said cavity.

6. The sensor system of claim 1, wherein an inner surface of said cavity comprises a stepped region configured to locate said nugget with respect to said cavity, said stepped region having a cross-sectional area less than a cross-sectional area of an end region of said nugget.

7. The sensor system of claim 1, wherein said grommet is abutting against a proximal end region of said nugget.

8. The sensor system of claim 1, wherein said first crimp is configured to compress said grommet to provide a seal between said harness sleeve and said grommet and a seal between said grommet and said at least one wire of said harness wire.

9. The sensor system of claim 1, wherein said nugget includes at least one geometric feature configured to facilitate loading and locking of said nugget in said harness sleeve.

10. The sensor system of claim 1, wherein said sensor comprises a temperature sensor.

11. The sensor system of claim 10, wherein said temperature sensor comprises a resistive temperature detector.

12. The sensor system of claim 1, wherein said cable is a mineral insulated cable.

13. The sensor system of claim 1, wherein said sensor is selected from the group consisting of a pressure sensor, a speed sensor and a position sensor.

14. A method of assembling a sensor system, said method comprising:
    advancing at least one wire of a wiring harness through at least one passageway of a grommet, said at least one wire having a at least one terminal coupled to a distal end;
    coupling a nugget to a portion of said at least one terminal;
    coupling a conductor of a cable to said at least one terminal;
    coupling said cable to a harness sleeve and to a sensor;
    receiving said nugget and at least a portion of said grommet within a cavity of said harness sleeve; and
    coupling said harness sleeve to said grommet for forming a seal.

15. The method of claim 14, wherein coupling said harness sleeve to said grommet comprises crimping said harness sleeve against said grommet.

16. The method of claim 14, further comprising coupling said harness sleeve to said nugget.

17. The method of claim 16, wherein coupling said harness sleeve to said nugget comprises crimping said harness sleeve to said nugget, wherein coupling said harness sleeve to said nugget reduces strain to said sensor.

18. A system comprising:
    a sensor system comprising:
    a sensor coupled to a cable;
    a wire harness assembly comprising at least one wire; and
    a coupler coupling said cable to said wire harness assembly, said coupler comprising:
        a nugget coupled to at least one terminal coupled to said at least one wire said wire harness to provide an orientation and spacing of said at least one terminal, said nugget further comprising a radial groove about the outside of said nugget;
        a grommet comprising an elastomeric material, wherein said grommet is adjacent to said nugget; and
        a harness sleeve coupled to said cable, said harness sleeve comprising:
            a cavity to receive said nugget and at least a portion of said grommet within;
            a first crimp compressing said elastomer material of the grommet to form a seal between said at least one wire of said wiring harness and said harness sleeve; and
            a second crimp aligned with said radial groove in said nugget, said second crimp securing said harness sleeve to the nugget, wherein said second crimp provides strain relief for said wire harness.

19. The system of claim 18, wherein said housing comprises an exhaust system.

20. The system of claim 19, wherein said sensor is selected from the group consisting of a temperature sensor, a pressure sensor, a speed sensor and a position sensor.

* * * * *